Oct. 18, 1966 B. FULLER 3,279,036
METHOD OF MANUFACTURING THERMOELECTRIC DEVICE
Filed Dec. 4, 1962 2 Sheets-Sheet 1
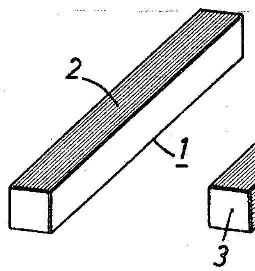
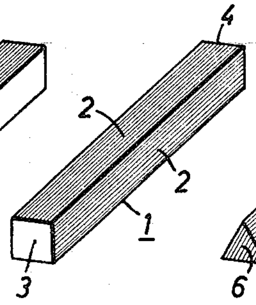
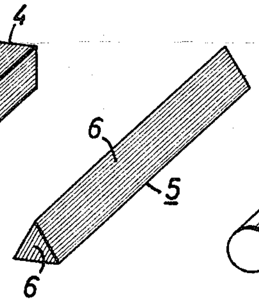
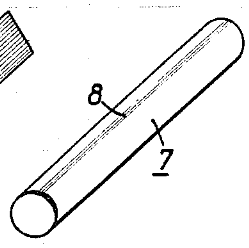
Fig.1 Fig.2 Fig.3 Fig.4
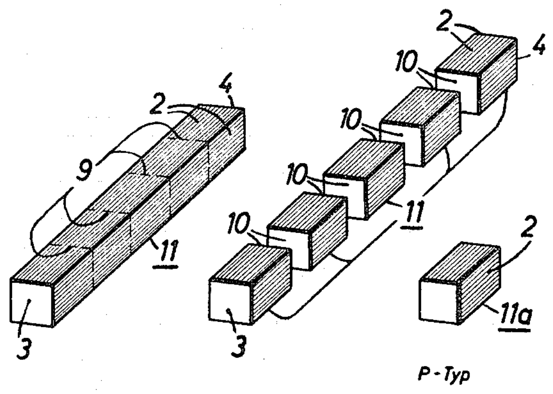
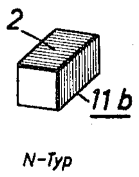
Fig.5 Fig.6 Fig.7 Fig.8
INVENTOR
BOYD FULLER
BY
AGENT Oct. 18, 1966 B. FULLER 3,279,036

METHOD OF MANUFACTURING THERMOELECTRIC DEVICE

Filed Dec. 4, 1962 2 Sheets-Sheet 2

INVENTOR
BOYD FULLER
BY
Frank R. Jeifari
AGENT

United States Patent Office 3,279,036

Patented Oct. 18, 1966

3,279,036

METHOD OF MANUFACTURING THERMO-ELECTRIC DEVICE

Boyd Fuller, Monschau, Germany, assignor to North American Philips Company, Inc., New York, N.Y., a corporation of Delaware Filed Dec. 4, 1962, Ser. No. 242,278
Claims priority, application Germany, Dec. 6, 1961, P 28,366
4 Claims. (Cl. 29—155.5)

The invention relates to a method of manufacturing a thermo-electric arrangement which comprises a plurality of semi-conductor elements which are connected in series with the interposition of contact members and alternately consist of different thermoelectric materials, and to a thermoelectric arrangement manufactured by this method.

As is known, in manufacturing thermoelectric arrangements, semi-conductor elements of n and p-conductivity type, which are obtained, for example, by the subdivision, specially by cutting, of semi-conductor bars, are connected in series, for example in a crenellated array, with the interposition of contact members which are secured to the elements by soldering or fusing. In operation the semi-conductor elements in known manner are so traversed by a current that the contacts provided on one side of the arrangement are cooled whereas the contacts provided on the other side are heated. Generally after assembly such an arrangement is embedded in an electrically insulated material to ensure mechanical stability.

The present invention is based upon the recognition that in manufacturing considerable advantages are obtainable if before assembling, or even before subdividing the bars, the side or sides of the semi-conductor elements or bars are coated with an electrically insulating layer.

During assembly the difficulty may occur that semiconductor elements of different materials or sizes are not readily distinguished. If, for example, these elements have substantially cubic shapes, their end faces cannot readily be distingushed from their side surfaces. Similarly p-type or n-type semi-conductor elements are not readily distinguishable.

In order to avoid these difficulties, in a method of manufacturing a thermoelectric arrangement which comprises a plurality of semi-conductor elements which are connected in series with the interposition of contact members and alternately consists of different thermoelectric materials, according to the invention before the assembly of the elements and the contact members at least part of the lateral surfaces or surface of each semi-conductor element is coated with an electrically insulating layer.

Another difficulty may be that in the process of securing the contact members by soldering or fusing the lateral surfaces of the elements are likely to be wetted by liquid material so that the efficiency of the arrangement is adversely affected. In a further embodiment of the method in accordance with the invention, for this purpose all the lateral surfaces, that is to say, the entire lateral surface area, may be coated with an electrically insulating layer. Such a layer provides the further advantage that the risk of poisoning, which exists with several usual semi-conductor materials used in thermoelectric apparatus, is reduced or entirely eliminated by such a layer if the material from which this layer is made up is at least substantially impermeable to the substances present in the semi-conductor element and/or their compounds and especially to the poisonous substances contained therein, and/or their poisonous compounds. This applies particularly to the use of semi-conductor elements containing tellurium.

A further advantage of this electrically insulating layer is provided if the material of the layer is at least substantially impermeable to chemical elements or compounds, for example, from the ambient atmosphere, which adversely affect the properties of the semi-conductor material of the thermo-electric elements, which permits of improving the stability of the properties of the said elements or bars especially during storage before assembly.

Such an insulating layed applied to the lateral surfaces of the elements also enables layers of metal or solder to be applied in a simple manner to the end face or faces of the elements owing to the fact that the elements can be coated with a metal layer on one or both end faces by simply immersing them in liquid metal. An important advantage is obtained if the end faces of the elements after the provision of the insulating coating, especially after the bar has been subdivided, are coated with a metal layer by fusing or soldering so that the risk of poisoning in handling the elements so treated is substantially eliminated. For this purpose and also to avoid spreading of the soldering material over the lateral surfaces of the semi-conductor elements during soldering of the arrangement, the electrically insulating layer preferably consists of a material which is capable of withstanding at least the fusing or soldering temperature in a degree such that wetting of the lateral surfaces by liquid metal is prevented.

The insulating layers used may be colored so that they are more readily noticed and enable the end faces and lateral faces to be distiguished from one another. In particular, elements of different semi-conductor materials, especially materials of different conductivity types, may be coated with layers of different colors, thus materially facilitating the distinction between the various semi-conductor elements.

In a method in which the semi-conductor elements are obtained by subdivision of bars, preferably before the dividing process, at least part of the lateral surface, preferably at least the entire lateral surface area, that is to say, including the two end faces, of the bars is provided with the electrically insulating layer. In this method several of the aforementioned advantages are obtained during the entire manufacturing process. What has been set forth hereinbefore with respect to the choice of the insulating layer for the elements applies correspondingly to the bars. The end faces of the bars may also be coated with layers of solder. Alternatively the end faces may be provided with the insulating layer together with the lateral surfaces.

The electrically insulating layer may be provided by applying a lacquer, preferably a silicone-base lacquer, or by slipping a sleeve, particularly a sleeve of synthetic resin, onto the semi-conductor elements or bars. Such a sleeve may be firmly joined to the element or bar by gluing or shrinking. The insulating layer may be so thin, especially if a lacquer is used, as to permit only a negligible or even substantially no heat transfer between the cold and hot contact areas, so that it substantially does not increase the heat dissipation.

The invention also relates to a thermoelectric arrangement which comprises a plurality of semi-conductor elements connected in series with the interposition of contact members and consisting alternately of different thermoelectric materials, in which in accordance with the invention at least part of the lateral surface area of each semiconductor element is coated with an electrically insulating layer. In such an arrangement preferably the entire lateral surface area of each semi-conductor element is completely coated with such a layer while the semiconductor elements which consist of different thermoelectric materials may be differently colored.

The invention also relates to semi-conductor bars or elements for use in thermo-electric arrangements, in which in accordance with the invention at least part of the lateral surface, preferably the entire lateral surface area, is coated with an electrically insulating layer. To facilitate assembly the insulating layer may be colored, and particularly elements consisting of different semi-conductor materials, for example, materials of different conductivity, types, may be coated with differently colored layers. In a preferred embodiment of the invention, in semi-conductor elements suitable for use in thermo-electric arrangements at least part of the surface area of the elements which is not covered by the electrically insulating layer, especially one or both end faces, is coated with a layer of metal, especially a layer of soldering material.

The invention will now be described more fully with reference to the drawings which show examples of embodiments of the method and of the semi-conductor elements according to the invention.

FIGURES 1 to 4 are perspective views of various semi-conductor bars.

FIGURES 5 and 6, which also are perspective views, show diagrammatically the process of subdividing a semi-conductor bar.

FIGURES 7 and 8 are perspective views of various semi-conductor elements.

Figure 9:
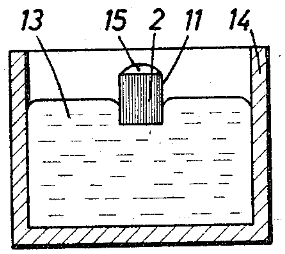
FIGURES 9 and 10 are part side elevations, part cross-sectional views of the process of immersing a semi-conductor body in molten metal.

A semi-conductor bar 1 shown in FIGURE 1 which consists, for example, of bismuth telluride or of mixed crystals of bismuth telluride and antimony telluride (p-type) or bismuth telluride and bismuth selenide (n-type), of square cross-section is coated for part of its lateral surface area, that is to say, on one of the four rectangular surface portions which form its sides, with a lacquer 2. In the semi-conductor bar 1 of FIGURE 2 the entire lateral surface area is coated with lacquer 2 and only the end faces 3 and 4 are not covered. The semi-conductor bar 5 of triangular cross-section shown in FIGURE 3 is coated on its entire surface area with a layer 6 of synthetic resin, while the lateral surfaces of the cylindrical semi-conductor bar 7 (FIGURE 4) are only provided with a strip of colored lacquer 8 to indicate, for example, its conductivity type. FIGURE 6 shows semi-conductor element 11 obtained by sawcuts 9 (FIGURE 5). The end faces 10 produced by the cuts obviously are not coated with the electrically insulating layer. This provides the further advantage that in mounting, for example, cube-shaped semi-conductor elements it is readily visible which of the surfaces are to be used for soldering.

The semi-conductor element **11*a* of p-type (FIGURE 7) and the semi-conductor element 11*b* of n-type FIGURE 8) are distinguished by the different colors of the layer 2**, as is indicated by different hatchings. The term "color" is used herein to include black, white or colorless. The differences of the layer may also consist in different reflection factors, for example, for visible light; that is to say, one kind of semi-conductor material is coated, for example, with a layer having a smooth surface while on the other semi-conductor material the layer is roughened.

Figure 10:
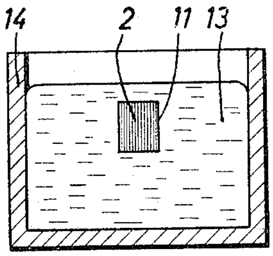

After division the semi-conductor elements are immersed in a bath of liquid tin solder 13 in a tank 14 (FIGURE 9). The non-coated parts, that is to say, the end faces, are covered with a cap 15 of solder. In FIGURE 9 one end face is already provided with such a cap 15. The term "solder" as used herein means not only a metal or alloy associated with a proper soldering process, but also metals, for example bismuth, or alloys intended to protect the surface of the semi-conductor element or to facilitate or permit a subsequent soldering operation. Alternatively, the caps 15 may be simultaneously produced, as FIGURE 10 shows, by immersing the entire semi-conductor element 11 in the liquid metal 13.

Figure 11:
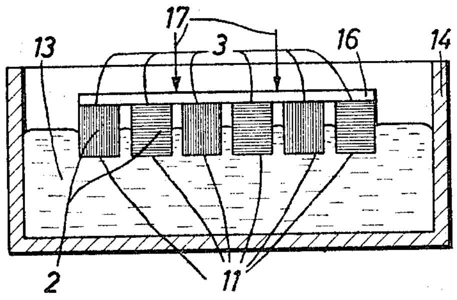
FIGURE 11 is a part side elevation, part cross-sectional view of the same process applied to a partly assembled semi-conductor arrangement.
Figure 12:
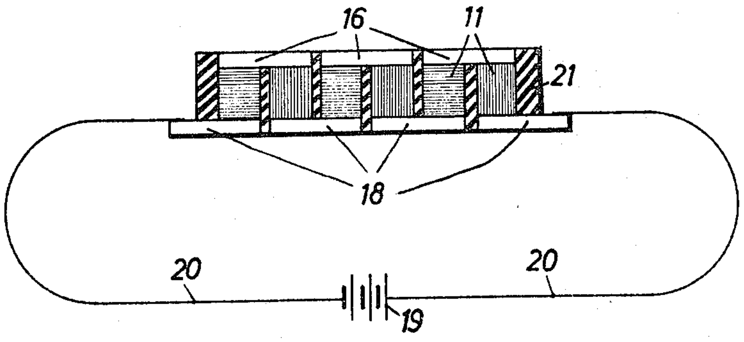
FIGURE 12 shows diagrammatically a finished thermo-electric arrangement.

FIGURE 11 shows semi-conductor elements 11 end faces 3 of which are soldered to a contact bridge 16 made, for example of copper. The different hatchings indicate the different colors of the layers 2. The semi-finished arrangement immersed in the liquid solder 13 is an arrangement of alternate p-type and n-type semi-conductor elements. When the arrangement is removed from the melt 13 the hitherto uncoated end faces of the semi-conductor elements 11 are also covered with caps of solder. They are then soldered to a contact strip also. The contact strip 16 (FIGURE 11) is then severed at the points indicated by the arrows 17, and the further contact strip (not shown) is severed at correspondingly intermediate points, so that the finished thermoelectric arrangement shown in FIGURE 12 is obtained. When through leads 20 a current from a battery 19 is then passed in a given direction through the said arrangement, as is shown schematically in FIGURE 12, the parts of the contact strip 16 will, for example, be cooled while the contact strips 18 are heated. To increase the mechanical strength the arrangement is embedded in insulating material 21 in the usual manner.

What is claimed is:

1. A method of manufacturing a thermoelectric device comprised of a plurality of soldered, serially-connected contact members and semiconductive elements of different thermoelectric materials in an alternating sequence, each of said semiconductive elements having lateral surfaces and end surfaces to be connected to the contact members, comprising the steps of providing elongated bars of said semiconductive elements of different materials, providing on substantially the whole lateral surfaces of each of the semiconductor bars of the same material a layer of electrically-insulating material which is not wetted by molten solder and which is substantially impermeable to constituents of the thermoelectric material and to constituents which may detrimentally affect the properties of the thermoelectric materials, thereafter subdividing the bars to form plural individual semiconductive elements whose lateral surfaces are substantially coated with said layer, and thereafter assembling the elements and contact members to form the device including the step of providing molten solder at the end surfaces of the elements and soldering them to the contact members.

2. A method as set forth in claim 1 wherein the layers are colored, and the colors of the layers of electrically-insulating material applied to the bars of different materials are different.

3. A method as set forth in claim 1 wherein the thermoelectric material contains tellurium as a constituent.

4. A method as set forth in claim 1 wherein the insulating material is a lacquer.

References Cited by the Examiner

UNITED STATES PATENTS

| | | | |
|---|---|---|---|
| 2,963,392 | 12/1960 | Dahlgren | 29—488 X |
| 2,968,866 | 1/1961 | Soper. | |
| 2,992,538 | 7/1961 | Poganski. | |
| 2,994,203 | 8/1961 | Lackey. | |
| 2,994,945 | 8/1961 | Cahill | 29—527 X |

JOHN F. CAMPBELL, *Primary Examiner.*

W. I. BROOKS, *Assistant Examiner.*